(12) United States Patent
Fukuhara (10) Patent No.: US 7,807,323 B2
(45) Date of Patent: Oct. 5, 2010

(54) EXPOSURE CONDITION SETTING METHOD, SEMICONDUCTOR DEVICE MANUFACTURING METHOD, AND EXPOSURE CONDITION SETTING PROGRAM

(75) Inventor: Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 776 days.

(21) Appl. No.: 11/783,469

(22) Filed: Apr. 10, 2007

(65) Prior Publication Data

US 2007/0238038 A1 Oct. 11, 2007

(30) Foreign Application Priority Data

Apr. 11, 2006 (JP) .............................. 2006-108944

(51) Int. Cl.
*G03F 9/00* (2006.01)

(52) U.S. Cl. ...................... 430/30; 430/945; 250/492.2; 250/492.22

(58) Field of Classification Search .................... 430/30, 430/945; 250/492.2, 492.22
See application file for complete search history.

(56) References Cited

U.S. PATENT DOCUMENTS 6,563,566 B2 * 5/2003 Rosenbluth et al. ........... 355/67
6,839,125 B2 1/2005 Hansen
7,057,709 B2 6/2006 Rosenbluth
2004/0265707 A1 12/2004 Socha
2006/0046168 A1 3/2006 Fukuhara

FOREIGN PATENT DOCUMENTS

| JP | 10-303114 | 11/1998 |
| JP | 2000-81697 | 3/2000 |
| JP | 2004-312027 | 11/2004 |

* cited by examiner

*Primary Examiner*—Christopher G Young
(74) *Attorney, Agent, or Firm*—Finnegan, Henderson, Farabow, Garrett & Dunner, L.L.P.

(57) ABSTRACT

A method of optimally setting exposure conditions when light emitted from an effective light source is applied to a mask pattern formed on a mask for exposure and diffracted light emitted from the mask is projected onto a substrate via a projection lens to expose the substrate thereto, the method comprising defining an image evaluation amount which represents characteristics of an optical image or a resist pattern and which contains a factor indicating the influence of a dimensional error of the mask pattern on the image characteristics, determining an initial condition of the effective light source and the mask pattern, defining at least one of a parameter of the effective light source and a parameter of the mask pattern, and changing at least one of the parameters to calculate the image evaluation amount, and deciding an optimum parameter on the basis of the result of the calculation.

20 Claims, 6 Drawing Sheets

FIG. 1

FIG. 2A  Width of light shielding region

EXPOSURE CONDITION SETTING METHOD, SEMICONDUCTOR DEVICE MANUFACTURING METHOD, AND EXPOSURE CONDITION SETTING PROGRAM

CROSS-REFERENCE TO RELATED APPLICATIONS

This application is based upon and claims the benefit of priority from prior Japanese Patent Application No. 2006-108944, filed Apr. 11, 2006, the entire contents of which are incorporated herein by reference.

BACKGROUND OF THE INVENTION

1. Field of the Invention

The present invention relates to an optical lithography technique, and more particularly, it relates to a method of setting exposure conditions for optimizing parameters of a mask pattern and a light source, a method of manufacturing a semiconductor device using the mask pattern and the light source, and a program of setting the exposure conditions.

2. Description of the Related Art

Recently, a technique has been proposed which optimizes both illumination conditions and mask dimensional conditions at the same time to form a micropattern with high dimensional accuracy (e.g., refer to Jpn. Pat. Appln. KOKAI Publication No. 2004-312027).

Furthermore, a technique has also been developed to form a micropattern using a liquid immersion exposure technique. The use of this liquid immersion exposure technique enables the NA of a projection lens to be 1 or more, and it is thus possible to use an exposure unit employing ArF excimer laser light having a wavelength of, for example, 193 nm as exposure light in order to form periodic patterns having a half pitch of 50 nm or less (e.g., refer to Jpn. Pat. Appln. KOKAI Publication No. 10-303114).

However, the influence of mask dimensional error, in particular, dimensional variations within one mask tends to increase along with the miniaturization of patterns. The dimensional variations within one semiconductor chip increase if there is an increase in the variations of the dimension of a resist on a substrate per mask dimensional error, that is, an increase in a value generally called a mask error factor (MEF). Moreover, since this error can not be reduced by the adjustment of exposure, the yield of semiconductor devices is reduced (e.g., refer to Jpn. Pat. Appln. KOKAI Publication No. 2000-81697).

Thus, the influence of the dimensional variations within one mask tends to increase along with the miniaturization of patterns, and this error can not be reduced by the adjustment of exposure, so that a reduction in the yield of semiconductor devices is unavoidable. This can be avoided if the dimensional accuracy of the mask is sufficiently increased, but there is a limit to the improvement in the dimensional accuracy in a mask manufacturing process.

BRIEF SUMMARY OF THE INVENTION

A method of an aspect of the present invention which optimally sets exposure conditions when light emitted from an effective light source is applied to a mask pattern formed on a mask for exposure and diffracted light emitted from the mask is projected onto a substrate via a projection lens to expose the substrate thereto, the method comprising:

defining an image evaluation amount which represents characteristics of an optical image or a resist pattern to be formed on the substrate and which contains a factor indicating the influence of a dimensional error of the mask pattern on the image characteristics; determining an initial condition of the effective light source and an initial condition of the mask pattern; defining at least one of a parameter indicating characteristics of the shape of the effective light source and a parameter indicating characteristics of the shape of the mask pattern; and changing at least one of the parameters to calculate the image evaluation amount, and deciding an optimum parameter on the basis of the result of the calculation.

A method of manufacturing a semiconductor device of an aspect of the present invention, the method comprising:

carrying out exposure by use of a mask pattern and an illumination set by the above exposure condition setting method.

A program of an aspect of the present invention which causes a computer to execute a method of optimally setting exposure conditions when light emitted from an effective light source is applied to a mask pattern formed on a mask for exposure and diffracted light emitted from the mask is projected onto a substrate via a projection lens to expose the substrate thereto, the method comprising:

defining an image evaluation amount which represents characteristics of an optical image or a resist pattern to be formed on the substrate and which contains a factor indicating the influence of a dimensional error of the mask pattern on the image characteristics; determining an initial condition of the effective light source and an initial condition of the mask pattern; defining at least one of a parameter indicating characteristics of the shape of the effective light source and a parameter indicating characteristics of the shape of the mask pattern; and changing at least one of the parameters to calculate the image evaluation amount, and deciding an optimum parameter on the basis of the result of the calculation.

DETAILED DESCRIPTION OF THE INVENTION

Hereinafter, details of the present invention will be described in connection with embodiments shown in the drawings.

First Embodiment

Figure 1:
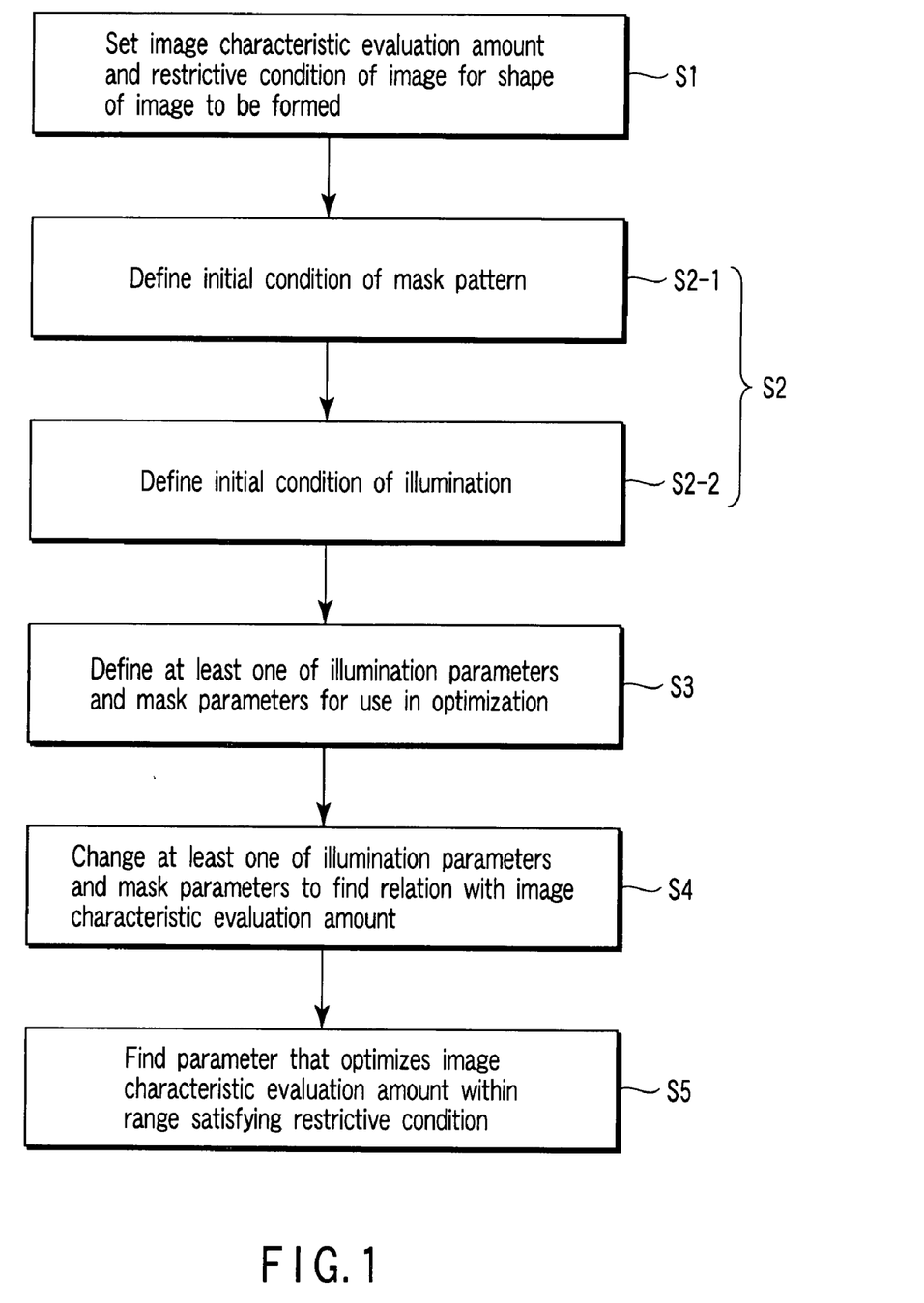
FIG. 1 is a flowchart for explaining an exposure condition setting method according to a first embodiment.

FIG. 1 is a flowchart for explaining an exposure condition setting method according to a first embodiment of the present invention.

In the present embodiment, parameters of a mask pattern and an illumination are optimally set as exposure conditions. It is to be noted that an example will be described below in which the present invention is applied to a general optical exposure method which applies light from a light source such as ArF excimer laser to a photomask and transfers the pattern of the photomask onto a substrate such as a wafer by a projection lens. However, the present invention can also be applied to a liquid immersion exposure method.

First, first step S1 comprises setting an image characteristic evaluation amount which represents characteristics of the shape of an image (optical image) to be formed, and a restrictive condition to be satisfied by the optical image.

There are defined an exposure margin EL necessary as the image characteristic evaluation amount which is an index of optimization, a mask dimensional variation range $\pm\Delta CD$, a minimum mask dimension $CD_{limit}$, and a ratio $cd_{tol}$ of a permissible error (½ of a range) of an image dimensional error to a half pitch. For example, EL=3%, $\Delta CD$=0.75 nm (on-substrate scale), minimum mask dimension=25 nm (on-substrate scale), and $cd_{tol}$=10%. The necessary exposure margin EL indicates the permissible range of an exposure error within a pattern region of one mask, and a higher numerical value permits a less severe standard of the exposure error.

Here, half of the mask dimensional variation range, $\Delta CD$, is an amount indicating the performance or dimensional error of a mask to be used, and is a constant. More particularly, it indicates variations of a mask dimension due to a manufacturing error when a plurality of patterns of the same dimension are to be arranged within the pattern region of one mask, and if this numerical value is lower, the mask or a mask manufacturing process is considered to be better. The minimum mask dimension $CD_{limit}$ is a restrictive condition indicating the minimum line or space that can be ensured by the dimension in the mask manufacturing process. The value of the minimum mask dimension $CD_{limit}$ for a line (shielding) pattern may be different from the value of the minimum mask dimension $CD_{limit}$ for a space (transmitting) pattern. $cd_{tol}$ is a permissible range of a completed dimension, and is a constant. More particularly, it indicates a dimensional accuracy required for the dimension of the image or resist, and, for example, a permissible resist dimensional error signifies 45 nm±10%, that is, (45 ±4.5) nm when $cd_{tol}$=10% for a half pitch of 45 nm.

Second steps S2 (S2-1 and S2-2) comprise defining a mask pattern to be formed (i.e., an initial condition of the mask pattern), and the shape of the illumination of an exposure unit (i.e., an initial condition of the illumination). That is, the initial condition of the mask pattern is defined in S2-1, and the initial condition of the illumination is defined in S2-2.

Third step S3 comprises defining one or more parameters (hereinafter, mask parameters) indicating characteristics of the shape of the mask pattern to be formed, and also defining one or more parameters (hereinafter, illumination parameters) indicating characteristics of the shape of the illumination of the exposure unit.

Figure 2A:
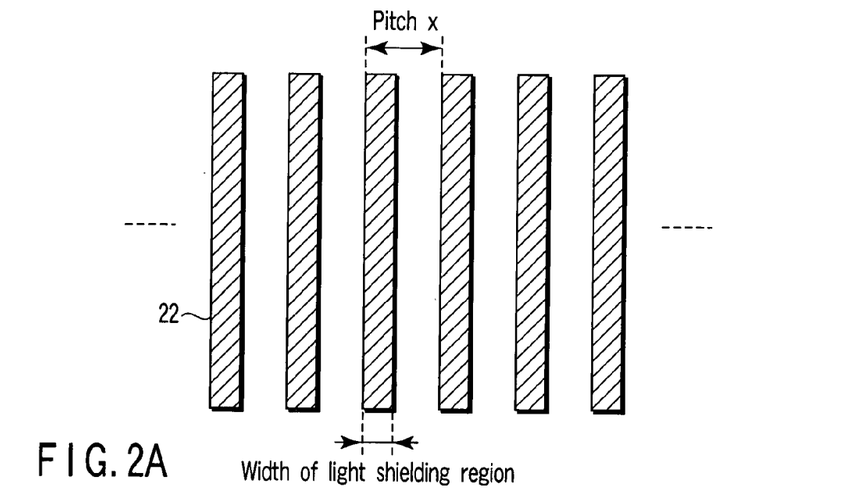
FIG. 2A is a diagram showing one example of a mask pattern used in the first embodiment.
Figure 2B:
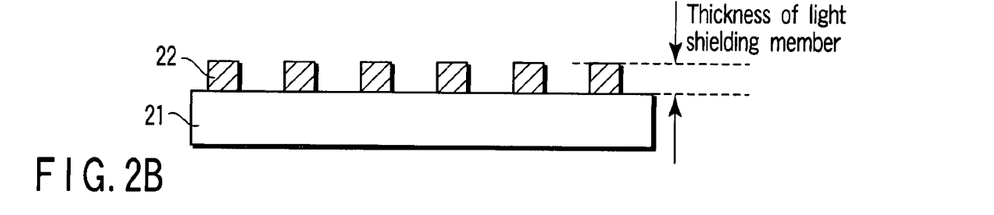
FIG. 2B is a diagram showing one example of the mask pattern used in the first embodiment.

For example, in the case of a one-dimensional line-and-space pattern as shown in FIGS. 2A and 2B, the parameters of the mask pattern use one or more of a ratio of a mask dimension indicating the width of a light shielding member to the pitch (duty ratio=the width of a light shielding region/pitch), the thickness, refractive index and extinction coefficient of the light shielding member. In addition, FIG. 2A is a plan view, and FIG. 2B is a sectional view, in which 21 indicates a transparent substrate, and 22 indicates a light shielding member.

When such a micropattern is formed, the pitch of the mask pattern is smaller than a wavelength, so that a conventionally used thin film mask approximation model does not enable an accurate prediction of the diffraction of light in the mask, and it is thus necessary to calculate the diffraction of light in accordance with the calculation of a numerical value based on Maxwell's equations, and predict the formation of an interference image on the substrate on the basis of the result of the calculation. As a method of the calculation of the numerical value, it is possible to use, for example, a rigorous coupled wave analysis (RCWA) or finite difference time domain (FDTD).

Figure 3:
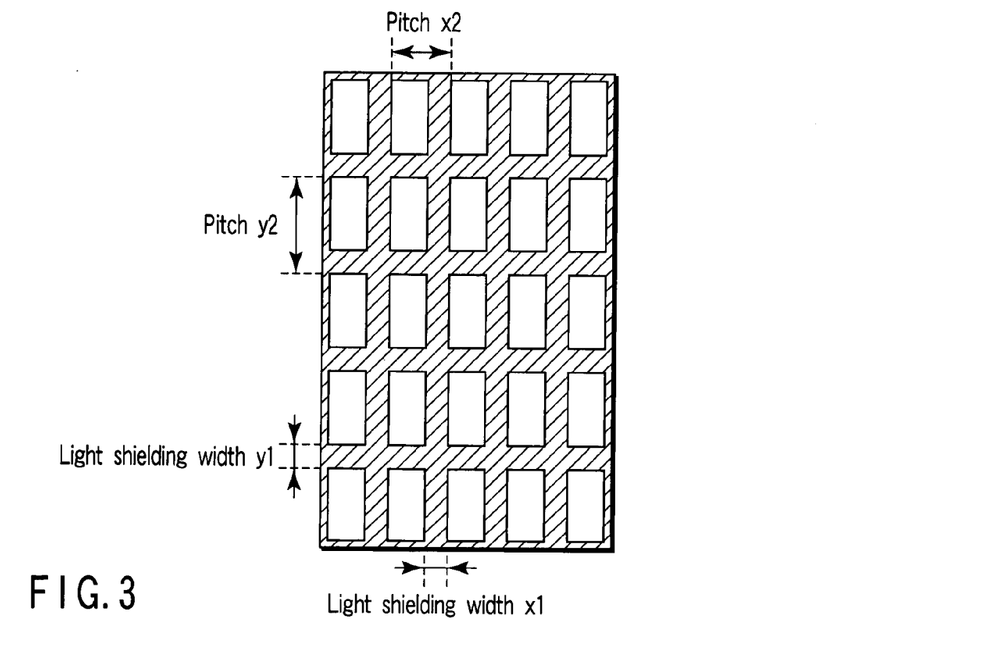
FIG. 3 is a diagram showing one example of the mask pattern used in the first embodiment.

Furthermore, as another example, use is made of one or more of a vertical duty ratio (=light shielding width x1/pitch x2), a horizontal duty ratio (=light shielding width y1/pitch y2), and the refractive index and extinction coefficient of the light shielding member, in the case of, for example, hole patterns two-dimensionally arranged as shown in FIG. 3.

Figure 4:
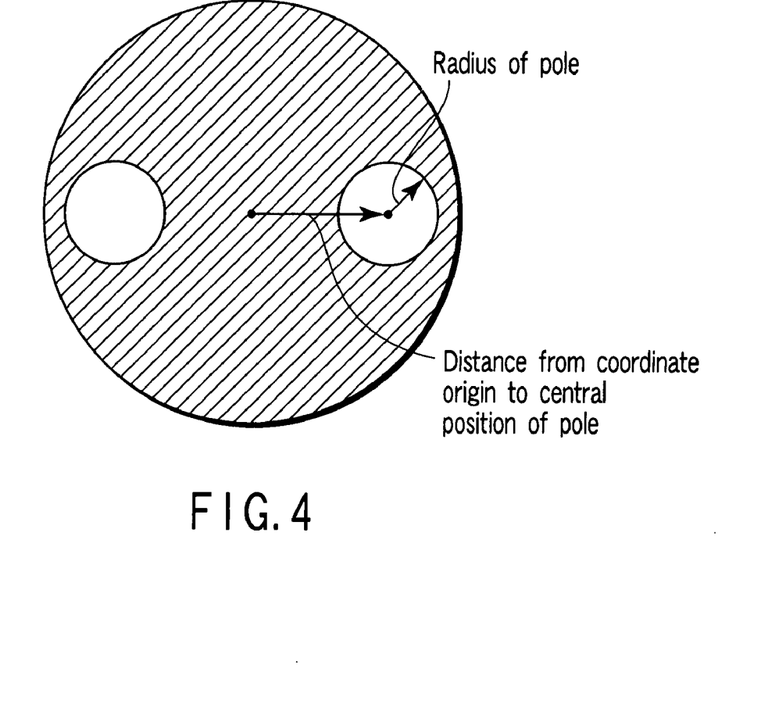
FIG. 4 is a diagram showing one example of the shape of an illumination used in the first embodiment.
Figure 5:
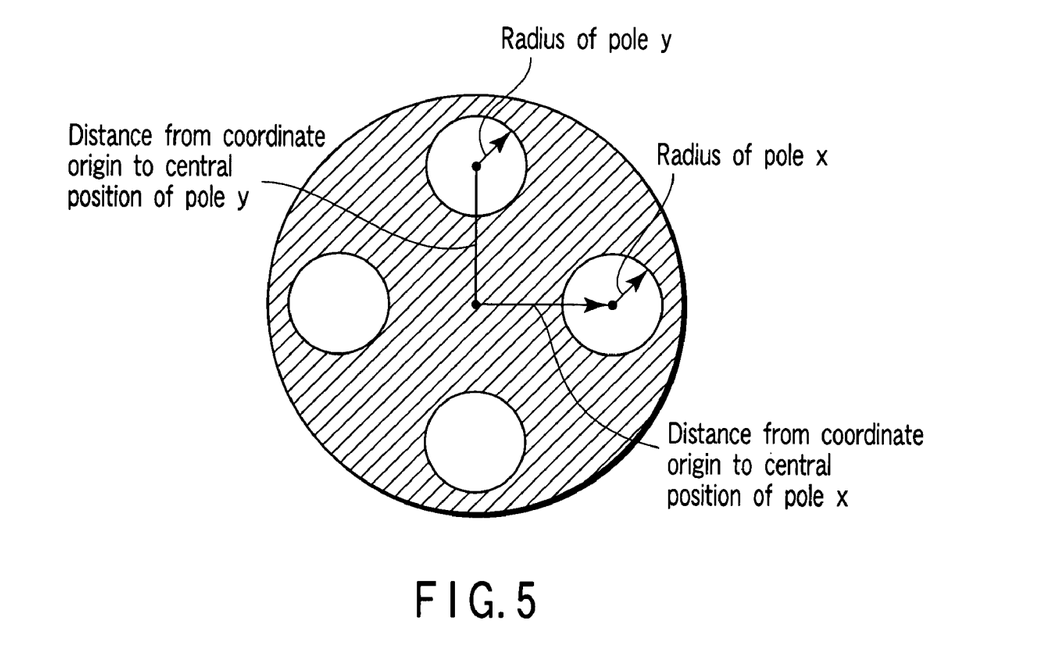
FIG. 5 is a diagram showing one example of the shape of the illumination used in the first embodiment.

When, for example, a dipole illumination is used, one or both of two parameters including the central position of a pole and the radius of the pole in an illumination σ coordinate system is defined as the parameters of the shape of the illumination, as shown in FIG. 4. As another example, when a quadrupole illumination is used, one or more of four parameters including the central position and the radius of the pole in an x direction and the central position and the radius of the pole in a y direction in the illumination a coordinate system is defined as shown in FIG. 5. In addition, the shape of the illumination is rotationally symmetrical at 180 degrees in FIG. 4 and FIG. 5.

Here, instead of defining the mask parameters and the illumination parameters in S3, the initial condition of the mask pattern and the mask parameters may be defined in S2-1, and the initial condition of the illumination and the illumination parameters may be defined in S2-2. Moreover, in S3, one or more mask parameters and one or more illumination parameters are defined, but only one of the mask parameters and the illumination parameters may be defined. That is, when adequate accuracy can be obtained by the optimum setting of only one of the mask parameters and the illumination parameters, only one of the mask parameters and the illumination parameters may be defined.

Fourth step S4 comprises determining an initial value of the mask parameters defined in S2-1 and an initial value of the illumination parameters defined in S2-2, and calculating an image under the exposure conditions indicated by the parameters, thereby calculating the image characteristic evaluation amount, that is, EL of the image. EL can be approximately calculated in accordance with, for example, the following equation:

$$EL = NILS \times cd_{tol} - a \times DoseMEF \times \Delta CD \tag{1}$$

Here, NILS is an amount called a normalized image log slope, and is defined by an amount in which a logarithmic slope of image intensity at the position of a pattern edge is multiplied by the width of the pattern. In general, higher NILS means higher contrast of the image. Moreover, a is a positive constant, is preferably 2, and may be 3 or 4. Furthermore, ΔCD is represented with on-substrate scale.

DoseMEF (exposure/mask error factor) indicates the amount of change in a correct exposure per unit change of the mask dimension, and is defined by the following equation:

$$DoseMEF = \{(\Delta E/E)/\Delta CD_{mask}\} \times 100 \qquad (2)$$

wherein E is a correct exposure under conditions of note, $\Delta CD_{mask}$ is a small mask dimensional error(on-substrate scale), and ΔE is the amount of change in the correct exposure for the mask error $\Delta CD_{mask}$.

The first term on the right side of Equation (1) is an approximate value of EL when there is no mask error, and the second term on the right side is an approximate value of the reduction of EL due to the mask dimensional error. The present embodiment is characterized by incorporating a factor indicating the influence of the mask dimensional error of the second term on the right side on the image characteristics.

Fifth step S5 comprises changing the mask parameters and the illumination parameters to calculate an image on the substrate, and calculating EL in accordance with Equation (1). Further, optimum conditions of the mask parameters and the illumination parameters are calculated in accordance with a known optimization technique such that EL is maximized or is equal to or greater than a predetermined value. As the optimization technique, it is possible to use, for example, a round robin algorithm, a simulated annealing method, or a genetic algorithm (GA). Here, a solution is found within such a range that the conditions of the minimum mask dimension $CD_{limit}$ defined in S1 are maintained.

Thus, according to the present embodiment, the approximate value (the second term on the right side of Equation (1)) of the reduction of EL due to the mask dimensional error is incorporated in the image evaluation amount EL which represents the characteristics of the optical image or the resist pattern to be formed on the substrate, such that it is possible to obtain optimum conditions of a combination of the mask pattern and the illumination under which the necessary exposure margin can be obtained even when there is a mask dimensional error within standards. Therefore, it is possible to improve the accuracy of pattern exposure, and contribute to an improvement in the production yield of semiconductor devices.

Figure 6:
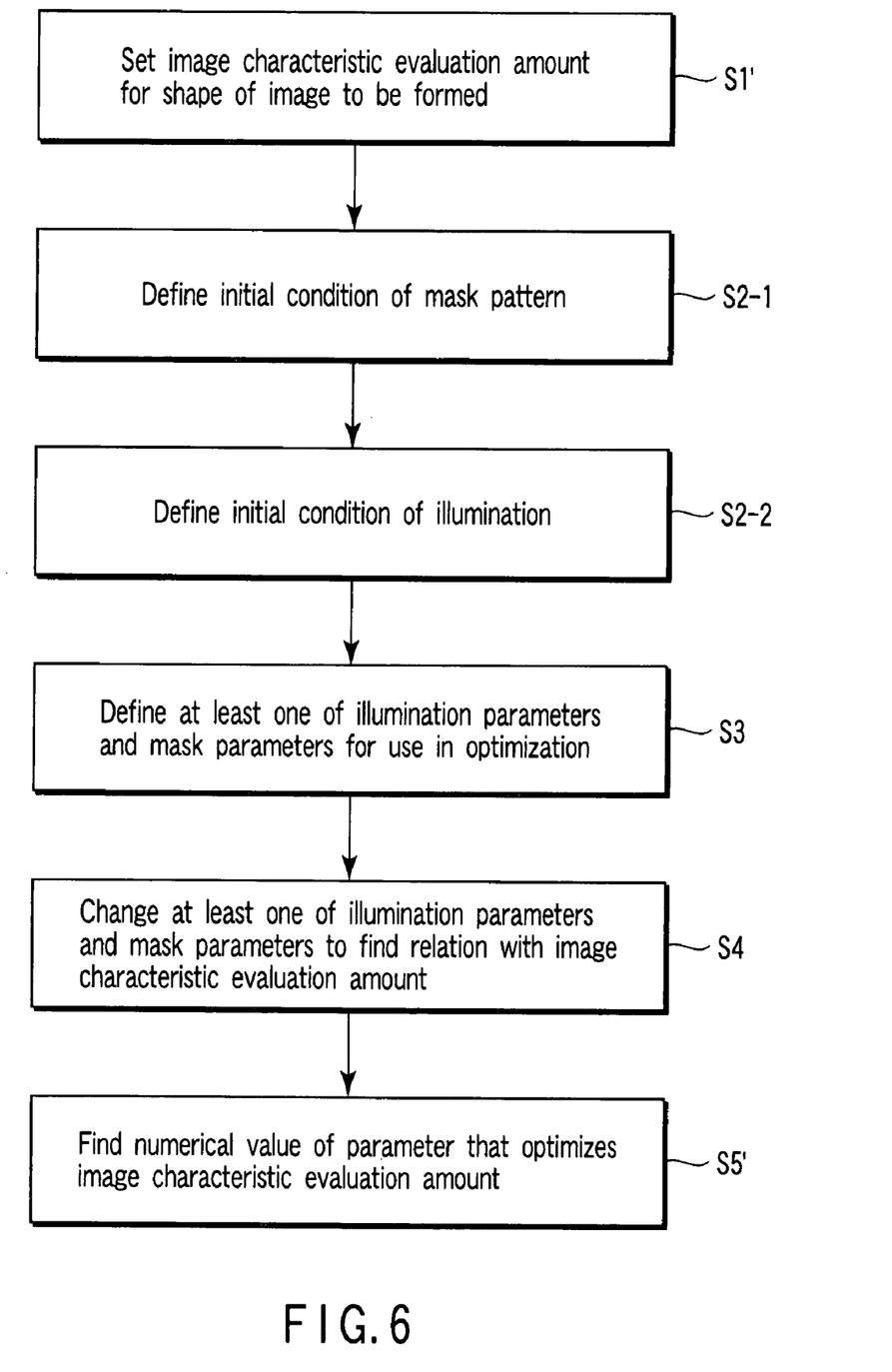
FIG. 6 is a flowchart for explaining a modification of the first embodiment.

In addition, while the minimum mask dimension $CD_{limit}$ is defined as the restrictive condition to be satisfied by the optical image in the present embodiment, the parameters can be optimally set without such a restrictive condition. A flowchart in this case is as shown in FIG. 6. That is, it is not necessary to set the restrictive condition in first step S1', and there is no need in fifth step S5' for a condition requiring a range that satisfies the restrictive condition. Therefore, computational processing is simpler in this case than in the case of FIG. 1.

Second Embodiment

As a second embodiment of the present invention, an example will be described in which another restrictive condition is set in the first embodiment.

Figure 7A:
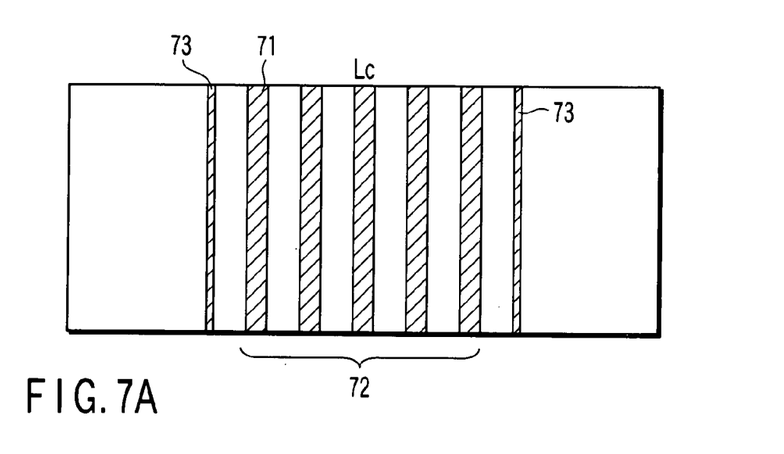
FIG. 7A is a diagram showing the relation between a mask pattern and light intensity to explain a second embodiment.

FIG. 7A shows an example wherein five dense line patterns are arranged, on both sides of which nontransfer patterns (also referred to in general as SRAFs) are arranged. In FIG. 7A, 71 denotes a light shielding member, 72 denotes transfer patterns, and 73 denotes nontransfer patterns. The nontransfer patterns 73 have a function of maintaining periodicity to improve the focal depth of periodic end patterns, and it is necessary that the nontransfer patterns 73 themselves be not transferred onto the substrate.

Figure 7B:
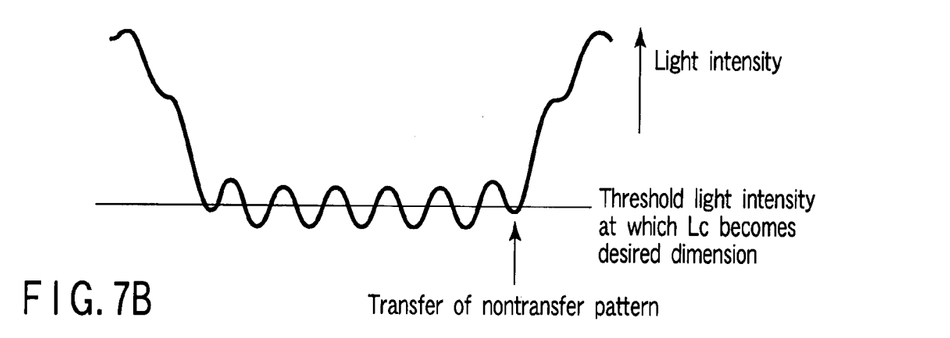
FIG. 7B is a diagram showing the relation between the mask pattern and the light intensity to explain the second embodiment.

FIG. 7B shows light intensity on the substrate when the patterns in FIG. 7A are exposed. The light intensity in the transfer pattern parts is low, and the light intensity in the nontransfer pattern parts is higher. Therefore, threshold light intensity can be selected so that the transfer patterns alone are resolved and the nontransfer patterns are not resolved.

When the optimization technique described in the first embodiment is applied to such patterns, EL of the central line of the five bars is used as the evaluation amount, and the restrictive condition requires that the minimum mask dimension=100 nm (mask scale) and that the image dimension of the SRAF be 0 under an exposure condition where the image dimension of the central line of the five bars be a predetermined value.

Under such a condition, optimum conditions for the mask and the illumination are found in accordance with the procedure of steps S1 to S4 in the first embodiment.

That is, first step S1 comprises setting an image characteristic evaluation amount which represents characteristics of the shape of an image (optical image) to be formed, and a restrictive condition.

Next, second step S2 comprises defining an initial condition of the mask pattern and an initial condition of the illumination. Further, third step S3 comprises defining one or more mask parameters and one or more illumination parameters.

Next, fourth step S4 comprises determining an initial value of the mask parameters and an initial value of the illumination parameters defined in S2, and calculating an image under the exposure conditions indicated by the parameters, thereby calculating the image characteristic evaluation amount EL in accordance with Equation (1).

Next, fifth step S5 comprises calculating optimum conditions of the mask parameters and the illumination parameters in accordance with a known optimization technique such that EL is maximized or is equal to or greater than a predetermined value. Then, a solution is found within such a range that the conditions of the minimum mask dimension $CD_{limit}$ defined in S1 are maintained and within such a range that the nontransfer patterns are not resolved.

Thus, according to the present embodiment, it is possible not only to obtain effects similar to those in the first embodiment, but also to obtain optimum conditions of a combination of the mask pattern and the illumination under which the necessary exposure margin can be obtained under the suppression of the resolution of the nontransfer patterns.

Third Embodiment

The present embodiment concerns a method which optimally sets parameters on the basis of an image characteristic evaluation amount which represents characteristics of a resist pattern instead of an optical image.

In the optimization using the dimension of the resist pattern instead of the optical image, EL can be approximately calculated in accordance with, for example, the following equation.

$$EL = EL_{max} - a \times DoseMEF \times \Delta CD \qquad (3)$$

where a is a positive constant, is preferably 2, and may be 3 or 4. $EL_{max}$ is an exposure margin when there is no mask error, and is expressed by the following equation:

$$(|E2-E1|/E0) \times 100 [\%]$$

ps wherein E0, E1 and E2 (mJ/cm²) are exposures in which the resist dimension under a best-focused condition is a predetermined value, the predetermined value+$cd_{tol}$(%), and the predetermined value-$cd_{tol}$(%), respectively. DoseMEF (exposure/mask error factor) indicates the amount of change in a correct exposure per unit change of the mask dimension, and its definition is common to Definitional Equation (2) of the optical image. Furthermore, ΔCD is represented with on-substrate scale.

In the evaluation using the dimension of the resist pattern as in the present embodiment, it is possible to find the optimum exposure conditions including effects in the baking and development of the substrate in addition to optical effects even though a little more time is required than in the optimization with the optical image. Therefore, the formation of patterns can be achieved with higher accuracy than in the first embodiment.

Fourth Embodiment

The present embodiment concerns an exposure condition setting method when EUV light is used instead of laser as a light source of an exposure unit.

While the ArF excimer laser is used as the light source of the exposure unit in the first to third embodiments, it should be understood that the light source may be, for example, fluorine (F2) excimer laser having a wavelength of 157 nm, or krypton fluoride (KrF) excimer laser having a wavelength of 248 nm. Moreover, the present embodiment is also applicable to liquid immersion exposure units of these light sources.

Furthermore, it should be understood that the light source is not limited to the excimer laser, and ultraviolet rays (i-rays) having a wavelength of 365 nm or extreme ultraviolet light (EUV) having a wavelength of 10 to 20 nm may be used.

When the exposure is carried out using the EUV light having a wavelength of 10 to 20 nm, the mask, lenses, etc., are reflective because there is no solid material transparent to the EUV light.

Figure 8:
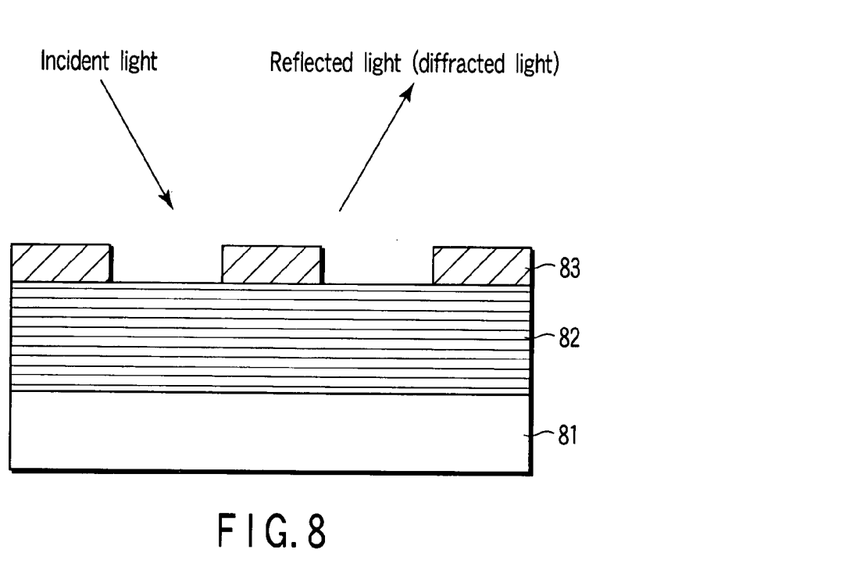
FIG. 8 is a diagram showing an example of a reflective mask to explain a fourth embodiment.

FIG. 8 shows an example of a mask used in a reflective exposure unit, in which an original plate of the pattern is formed of an absorber and a reflective surface. In addition, in FIG. 8, 81 denotes a transparent substrate, 82 denotes a multilayer reflective film of Mo/Si, and 83 denotes an absorber made of Cr, TaN, etc.

Figure 9:
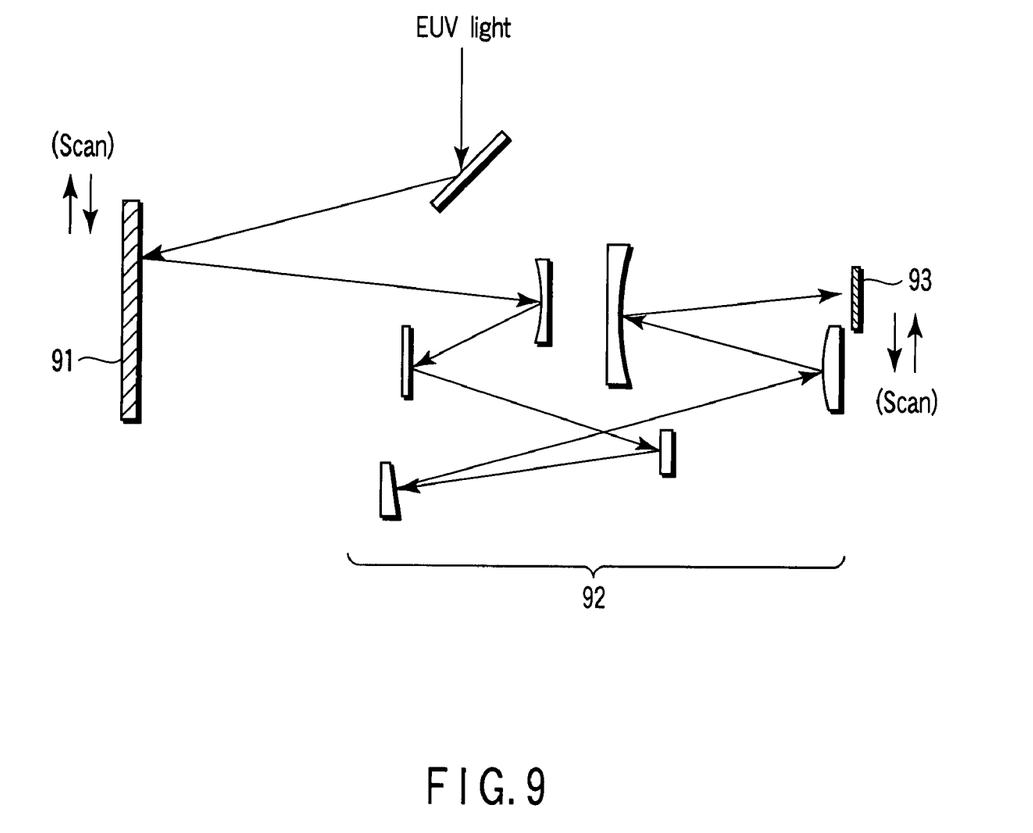
FIG. 9 is a diagram showing an example of an exposure unit having a projection optical system composed of reflection optical systems to explain the fourth embodiment.

FIG. 9 shows an example of an exposure unit having a projection optical system composed of reflection optical systems. An optical path is in a vacuum, and the EUV light from an illumination optical system is applied to a mask 91, and the EUV light reflected by the mask 91 is then projected onto a substrate 93 via reflective lenses and mirrors of a projection optical system 92.

As in the first embodiment, such EUV exposure also sequentially carries out the setting of an image characteristic evaluation amount and a restrictive condition (S1); the definition of an initial condition of the mask pattern and an initial condition of the illumination (S2); the definition of mask parameters and illumination parameters (S3); the calculation of the image characteristic evaluation amount EL (S4); and the calculation of optimum conditions of the mask parameters and the illumination parameters (S5). Thus, as in the first embodiment, it is possible to obtain optimum conditions of a combination of the mask pattern and the illumination under which the necessary exposure margin can be obtained even when there is a mask dimensional error within standards. Therefore, it is possible to improve the accuracy of pattern exposure, and contribute to an improvement in the production yield of semiconductor devices.

MODIFICATION

It is to be noted that the present invention is not limited to the embodiments described above. In the embodiments, the parameters of the mask pattern can be changed suitably to specifications without being limited to the ratio of a mask dimension to the pitch (duty ratio=width of light shielding region/pitch), the thickness, refractive index, extinction coefficient, etc., of the light shielding member. The parameters of the shape of the illumination can also be changed suitably to specifications without being limited to the two parameters of the dipole illumination or the four parameters of the quadrupole illumination. Moreover, it is not always necessary to define both the mask parameters and the illumination parameters, and one of them may only be defined.

Furthermore, while the exposure condition setting method has been described in the embodiments, the present invention can also be applied to a program storing such a setting method in a storage medium. For example, a program may be created which outputs the result of designing a mask pattern and an illumination by implementing any one of the first to fourth embodiments on the basis of an input image evaluation amount, a restrictive condition, a mask pattern initial value, illumination condition initial value, and information on parameters indicating characteristics of the shape of an effective light source or parameters indicating characteristics of the shape of the mask pattern. This makes it possible to obtain the optimum mask pattern and illumination in a short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of optimally setting exposure conditions when light emitted from an effective light source is applied to a mask pattern formed on a mask for exposure and diffracted light emitted from the mask is projected onto a substrate via a projection lens to expose the substrate thereto, the method comprising:

defining an image evaluation amount which represents characteristics of an optical image or a resist pattern to be formed on the substrate and which contains a factor indicating the influence of a dimensional error of the mask pattern on the image characteristics;

determining an initial condition of the effective light source and an initial condition of the mask pattern;

defining at least one of a parameter indicating characteristics of the shape of the effective light source and a parameter indicating characteristics of the shape of the mask pattern; and changing at least one of the parameters to calculate the image evaluation amount, and deciding an optimum parameter on the basis of the result of the calculation.

2. The method according to claim 1, wherein a factor M indicating the influence of the dimensional error of the mask pattern on the image characteristics is decided by $$M = \Delta E/\Delta CD_{mask}$$

where Δ is the rate of change in a correct exposure per mask dimensional change .DELTA.CD.sub.mask indicating dimensional variations of the mask pattern on-substrate scale.

3. The method according to claim 2, wherein when the image evaluation amount represents the characteristics of the optical image, the image characteristic evaluation amount EL is indicated by $$EL = NILS \times cd_{tol} - a \times M \times \Delta CD$$

(a is a positive constant)
wherein a ratio of a permissible error of an image dimension to a half pitch is used as $cd_{tol}$, a normalized image log slope is used as NILS, and a mask dimensional variation range on-substrate scale is used as $\pm\Delta CD$.

4. The method according to claim 2, wherein when the image evaluation amount represents the characteristics of the resist pattern, the image characteristic evaluation amount EL is indicated by $$EL = EL_{max} - a \times M \times \Delta CD$$

(a is a positive constant)
wherein an exposure margin in the case of no mask error is used as $EL_{max}$, and a mask dimensional variation range on-substrate scale is used as $\pm\Delta CD$.

5. The method according to claim 1, wherein the image characteristic evaluation amount is defined, and a restrictive condition to be satisfied by the optical image or the resist pattern is set.

6. The method according to claim 5, wherein the optical image has transfer patterns and nontransfer patterns, and the nontransfer patterns maintain periodicity and are not transferred onto the substrate.

7. The method according to claim 1, wherein
the parameter indicating characteristics of the shape of the effective light source is defined by use of a dipole illumination.

8. The method according to claim 1, wherein
the parameter indicating characteristics of the shape of the effective light source is defined by use of a quadrupole illumination.

9. The method according to claim 1, wherein
the parameter indicating characteristics of the shape of the mask pattern is defined by use of a rigorous coupled wave analysis.

10. The method according to claim 1, wherein
the parameter indicating characteristics of the shape of the mask pattern is defined by use of a finite difference time domain.

11. The method according to claim 1, wherein
the parameter indicating characteristics of the shape of the mask pattern is defined by use of one or more of a ratio of the dimension of the mask for exposure to a pitch, and the refractive index and extinction coefficient of a light shielding member.

12. The method according to claim 1, wherein
the optimum parameter is found by a round robin algorithm.

13. The method according to claim 1, wherein
the optimum parameter is found by a simulated annealing method.

14. The method according to claim 1, wherein
the optimum parameter is found by a genetic algorithm.

15. The method according to claim 1, wherein
the effective light source is excimer laser.

16. The method according to claim 15, wherein
the excimer laser is applied to a liquid immersion exposure technique.

17. The method according to claim 1, wherein the effective light source is EUV light.

18. The method according to claim 17, wherein
the mask for exposure and the projection lens are reflective.

19. A method of manufacturing a semiconductor device comprising carrying out exposure by use of a mask pattern and an illumination set by a method according to claim 1.

20. A program which causes a computer to execute a method of optimally setting exposure conditions when light emitted from an effective light source is applied to a mask pattern formed on a mask for exposure and diffracted light emitted from the mask is projected onto a substrate via a projection lens to expose the substrate thereto, the method comprising:
defining an image evaluation amount which represents characteristics of an optical image or a resist pattern to be formed on the substrate and which contains a factor indicating the influence of a dimensional error of the mask pattern on the image characteristics;
determining an initial condition of the effective light source and an initial condition of the mask pattern;
defining at least one of a parameter indicating characteristics of the shape of the effective light source and a parameter indicating characteristics of the shape of the mask pattern; and
changing at least one of the parameters to calculate the image evaluation amount, and causing the computer to decide an optimum parameter on the basis of the result of the calculation.

* * * * *

UNITED STATES PATENT AND TRADEMARK OFFICE
CERTIFICATE OF CORRECTION

PATENT NO.         : 7,807,323 B2                                   Page 1 of 1
APPLICATION NO.    : 11/783469
DATED              : October 5, 2010
INVENTOR(S)        : Fukuhara It is certified that error appears in the above-identified patent and that said Letters Patent is hereby corrected as shown below:

* Claim 2, column 8, line 65, change "Δis" to --ΔE is--.

Claim 2, column 8, line 66, change ".DELTA.CD.sub.mask" to --$\Delta CD_{mask}$--.

Signed and Sealed this
Fourth Day of January, 2011

David J. Kappos
*Director of the United States Patent and Trademark Office*